United States Patent
Xie et al.

(10) Patent No.: US 10,685,874 B1
(45) Date of Patent: Jun. 16, 2020

(54) SELF-ALIGNED CUTS IN AN INTERCONNECT STRUCTURE

(71) Applicant: GLOBALFOUNDRIES Inc., Grand Cayman (KY)

(72) Inventors: Ruilong Xie, Niskayuna, NY (US); Hui Zang, Guilderland, NY (US); Lei Sun, Altamont, NY (US); Lars Liebmann, Mechanicville, NY (US); Daniel Chanemougame, Niskayuna, NY (US); Guillaume Bouche, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/220,565

(22) Filed: Dec. 14, 2018

(51) Int. Cl.
| | |
|---|---|
| *H01L 21/4763* | (2006.01) |
| *H01L 21/768* | (2006.01) |
| *H01L 21/02* | (2006.01) |
| *H01L 21/311* | (2006.01) |
| *H01L 21/3213* | (2006.01) |

(52) U.S. Cl.
CPC .... *H01L 21/76834* (2013.01); *H01L 21/0228* (2013.01); *H01L 21/02126* (2013.01); *H01L 21/02164* (2013.01); *H01L 21/02178* (2013.01); *H01L 21/31144* (2013.01); *H01L 21/32133* (2013.01); *H01L 21/76816* (2013.01); *H01L 21/76832* (2013.01); *H01L 21/76897* (2013.01)

(58) Field of Classification Search
CPC ......... H01L 21/76897; H01L 21/76837; H01L 29/0649; H01L 29/66566; H01L 30/0673; H01L 21/76224
USPC .................................................. 438/637, 639
See application file for complete search history.

(56) References Cited

U.S. PATENT DOCUMENTS

| | | | | |
|---|---|---|---|---|
| 6,780,714 | B2* | 8/2004 | Gajda | H01L 29/1095 438/270 |
| 7,307,011 | B2* | 12/2007 | Feng | H01L 21/7682 257/E21.573 |
| 2005/0095837 | A1* | 5/2005 | Feng | H01L 21/7682 438/619 |
| 2012/0104509 | A1* | 5/2012 | Matsumoto | H01L 21/28097 257/369 |
| 2013/0283586 | A1 | 10/2013 | Franchet et al. | |

(Continued)

FOREIGN PATENT DOCUMENTS

| | | |
|---|---|---|
| JP | 2017209727 A | 11/2017 |
| WO | 2017200005 A1 | 11/2017 |

*Primary Examiner* — S. V. Clark
(74) *Attorney, Agent, or Firm* — Thompson Hine LLP; Anthony Canale

(57) ABSTRACT

Methods for forming a cut between interconnects and structures with cuts between interconnects. A layer is patterned to form first, second, and third features having a substantially parallel alignment with the second feature between the first feature and the third feature. A sacrificial layer is formed that is arranged between the first and second features and between the second and third features. The sacrificial layer is patterned to form a cut between the first and second features from which a portion of the sacrificial layer is fully removed and to form a cavity in a portion of the sacrificial layer between the second and third features. A dielectric layer is formed inside the cut between the first and second features. After depositing the section of the dielectric material and forming the dielectric layer, the sacrificial layer is removed.

17 Claims, 15 Drawing Sheets

(56) References Cited

U.S. PATENT DOCUMENTS

2016/0056104 A1 2/2016 Bouche et al.
2016/0104641 A1* 4/2016 Yang ................. H01L 21/76897
  257/774

* cited by examiner

SELF-ALIGNED CUTS IN AN INTERCONNECT STRUCTURE

BACKGROUND

The present invention relates to semiconductor device fabrication and integrated circuits and, more specifically, to methods for forming a cut between interconnects and structures with cuts between interconnects.

A back-end-of-line interconnect structure may be used to connect device structures, which were fabricated on a substrate during front-end-of-line processing, with each other and with the environment external to the chip. Self-aligned multiple patterning processes used to form an interconnect structure involve linear mandrels acting as sacrificial features that establish a feature pitch. Non-mandrel lines are arranged as linear spaces between sidewall spacers that are formed adjacent to the sidewalls of the mandrels. After the mandrels are pulled to define mandrel lines, the sidewall spacers are used as an etch mask to etch a pattern predicated on the mandrel lines and the non-mandrel lines into an underlying hardmask. The pattern is subsequently transferred from the hardmask to an interlayer dielectric layer as trenches in which the interconnects of the interconnect structure are formed.

Mandrel cuts may be formed in the mandrels in order to section the mandrels and define discontinuities between the different sections. Non-mandrel cuts may also be formed as discontinuities along non-mandrel lines and may include portions of the spacer material used to form the sidewall spacers. The mandrel cuts and non-mandrel cuts are included in the pattern that is transferred to the hardmask and subsequently transferred from the hardmask to form the trenches in the interlayer dielectric layer. The mandrel cuts and non-mandrel cuts appear in the interconnect structure as adjacent interconnects that are aligned and spaced apart at their respective ends with a tip-to-tip spacing related to the dimension of the discontinuity.

The need for double patterning can be eliminated through the use of extreme ultraviolet (EUV) patterning, which is capable of directly patterning a resist. The resist may then be used in conjunction with an etching process to form a dense sea of narrow lines and trenches in an interlayer dielectric layer. However, the formation of cuts in the interconnects formed in the narrow trenches presents technical challenges with respect to techniques, as well as materials.

Improved methods for forming a cut between interconnects and structures with cuts are therefore needed.

SUMMARY

In an embodiment of the invention, a method includes patterning a layer to form first, second, and third features having a substantially parallel alignment with the second feature between the first feature and the third feature. The method further includes forming a sacrificial layer arranged between the first feature and the second feature and between the second feature and the third feature. The method further includes patterning the sacrificial layer to form a cut between the first feature and the second feature from which a portion of the sacrificial layer is fully removed and to form a cavity in a portion of the sacrificial layer between the second feature and the third feature. A dielectric layer is formed inside the cut between the first feature and the second feature. After depositing the section of the dielectric material and forming the dielectric layer, the sacrificial layer is removed.

In an embodiment of the invention, a structure includes an interlayer dielectric layer an interlayer dielectric layer having a trench, a first interconnect arranged in the trench in the interlayer dielectric layer, and a second interconnect arranged in the trench in the interlayer dielectric layer. The second interconnect has a lengthwise alignment with the first interconnect. A section of a dielectric layer is arranged in the trench in the interlayer dielectric layer between the first interconnect and the second interconnect. A sidewall spacer is arranged in the trench in the interlayer dielectric layer between the section of the dielectric layer and the interlayer dielectric layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
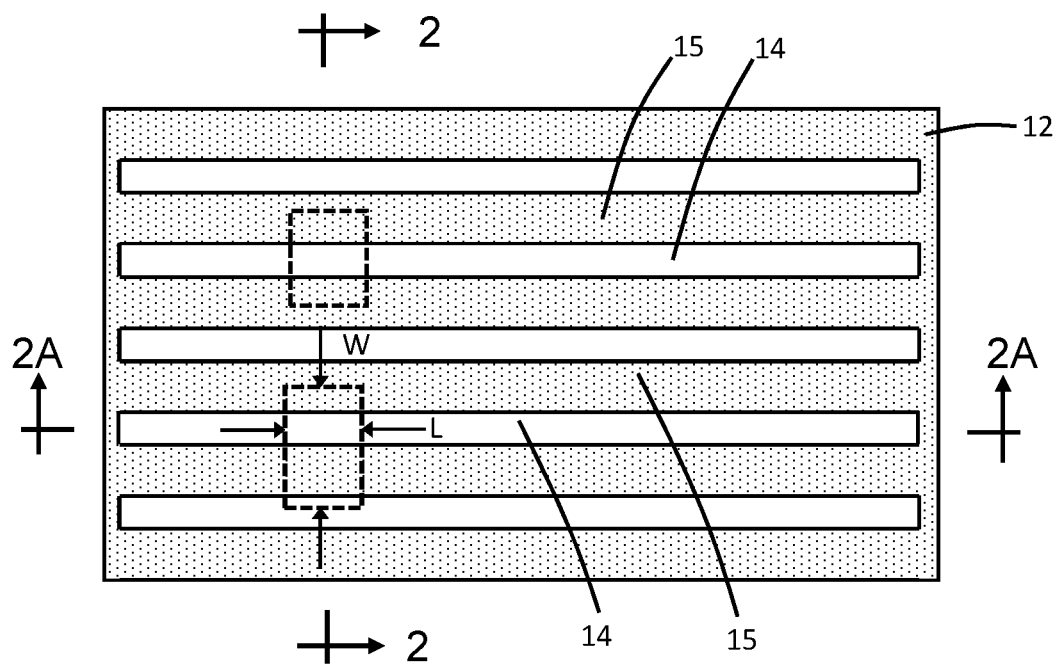
FIG. 1 is a top view of a structure at an initial fabrication stage of a processing method in accordance with embodiments of the invention.
Figure 2:
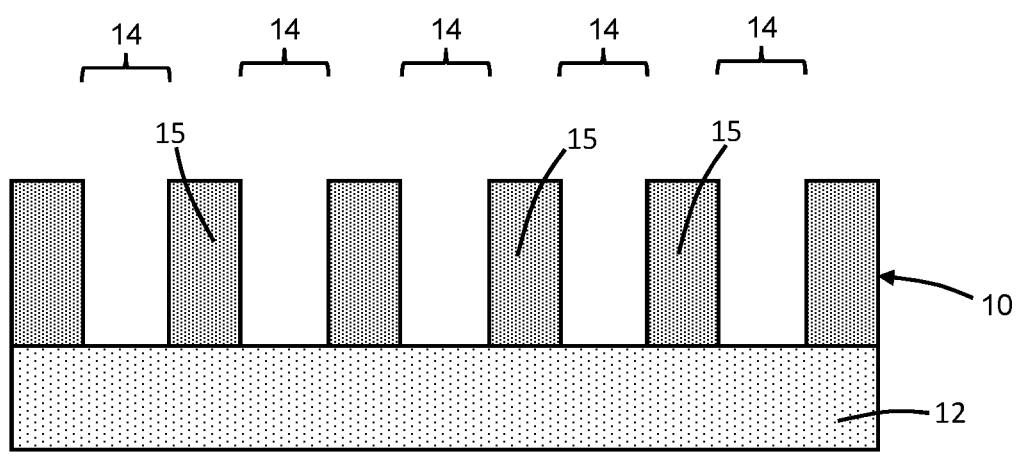
FIG. 2 is a cross-sectional view taken generally along line 2-2 in FIG. 1.
Figure 2A:
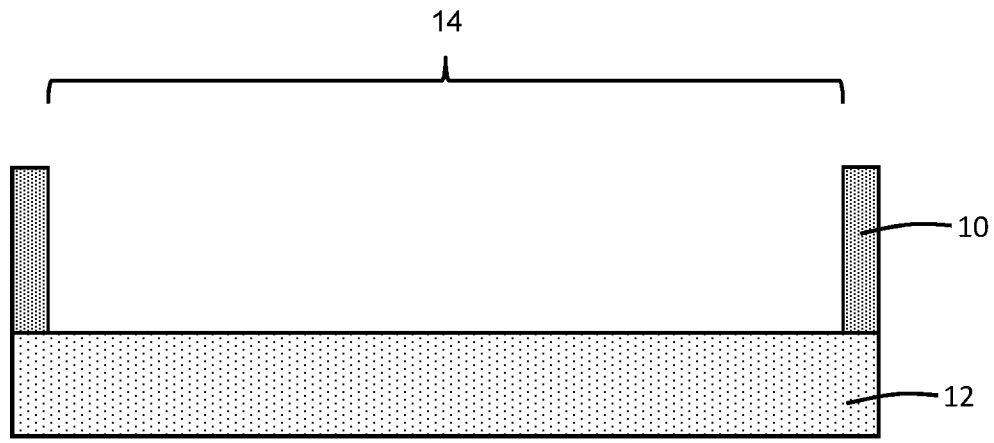
FIG. 2A is a cross-sectional view taken generally along line 2A-2A in FIG. 1.

With reference to FIGS. 1, 2, 2A and in accordance with embodiments of the invention, an interlayer dielectric layer 10 may be composed of one or more electrically-insulating dielectric materials, such as a low-k dielectric material formed using a siloxane such as octamethylcyclotetrasiloxane (OMCTS). The interlayer dielectric layer 10 may be located over a layer 12 that may include device structures fabricated by front-end-of-line (FEOL) processing to form an integrated circuit and/or metallization. The interlayer dielectric layer 10 is patterned to include trenches 14 that extend to the layer 12. The trenches 14 may be formed by extreme ultraviolet (EUV) lithography and etching processes, and may have a narrow critical dimension of, for example, 28 nanometers. The trenches 14, which may have a parallel alignment, are separated by lines 15 of the dielectric material of the interlayer dielectric layer 10. The dashed boxes in FIG. 1 indicate the locations of cuts relative to the trenches 14 that are subsequently formed as described hereinbelow.

Figure 3:
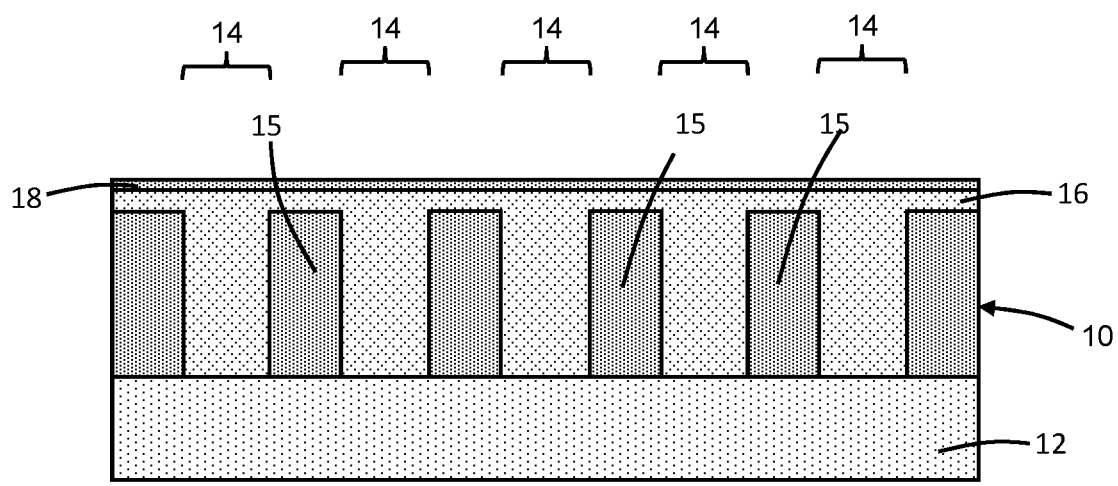
FIGS. 3-10 and 3A-10A are cross-sectional views of the structure at successive fabrication stages of the processing method subsequent to the fabrication stage of FIGS. 1, 2, 2A.
Figure 3A:
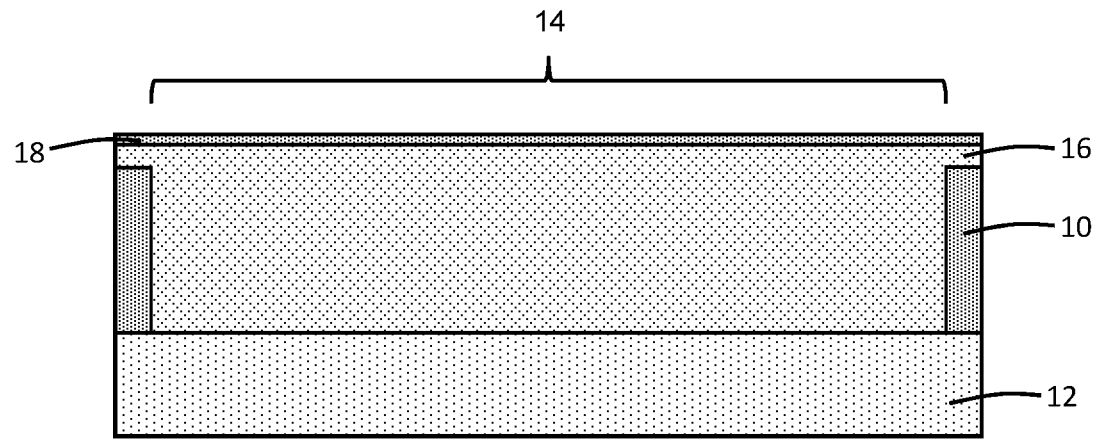

With reference to FIGS. 3, 3A in which like reference numerals refer to like features in FIGS. 2, 2A and at a subsequent fabrication stage of the processing method, a planarizing layer 16 and a hardmask layer 18 are formed over the interlayer dielectric layer 10. The planarizing layer 16, which has a planar top surface, may be a spin-on hardmask that is composed of an organic material. In an embodiment, the organic material contained in the planarizing layer 16 may be a polymer that is carbon-based. In an embodiment, the organic material contained in the planarizing layer 16 may be an organic planarization layer (OPL) material. The planarizing layer 16 provides gap fill of the trenches 14, and has a thickness that is sufficient to cover and bury the lines 15 of the interlayer dielectric layer 10. The planarizing layer 16 may be applied and etched back, followed by the deposition of the hardmask layer 18.

Figure 4:
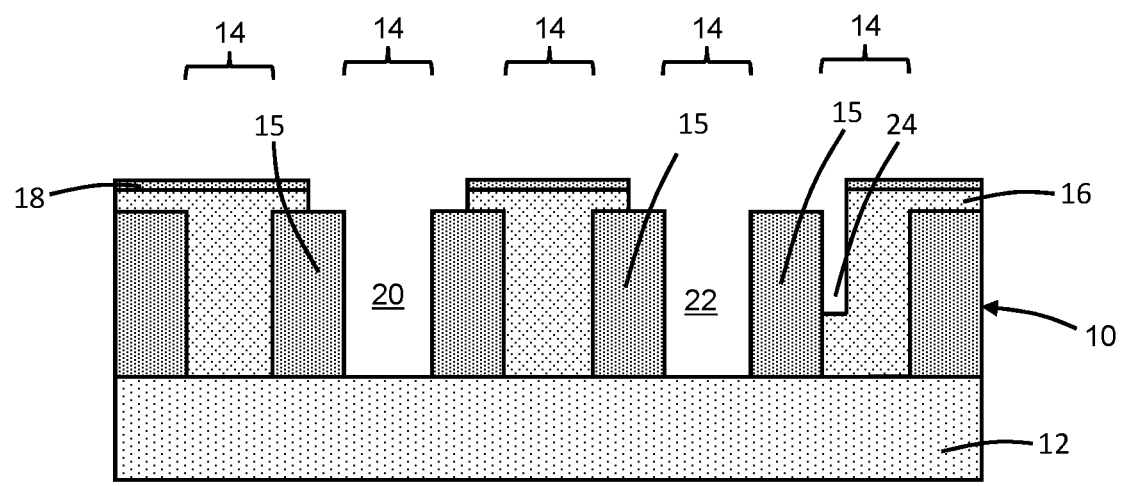
Figure 4A:
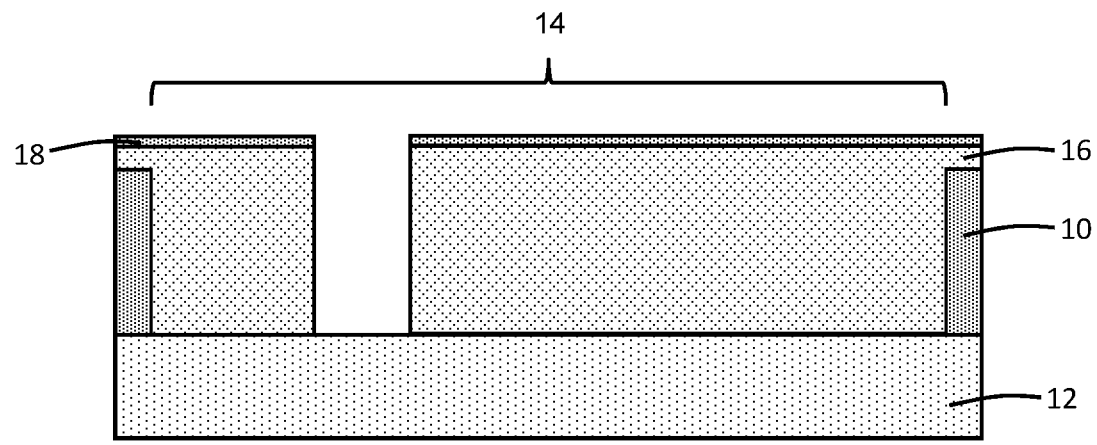

With reference to FIGS. 4, 4A in which like reference numerals refer to like features in FIGS. 3, 3A and at a subsequent fabrication stage of the processing method, the planarizing layer 16 and hardmask layer 18 are patterned to form cuts 20, 22 in the planarizing layer 16 arranged inside the trenches 14. Each of the cuts 20, 22 has a length, L, and a width, W. The cut 20 is well aligned in that the edges of the opening in the planarizing layer 16 are arranged over the lines 15 of the interlayer dielectric layer 10. The cut 22 is misaligned in that one of the edges of the opening in the planarizing layer 16 overlaps in part with the planarizing layer 16 inside an adjacent trench 14 in the interlayer dielectric layer 10. The result is the formation of a cavity 24 in the planarizing layer 16 inside the adjacent trench 14. The cavity 24, which is smaller in a width dimension than the cuts 20, 22, is an artifact of cut formation and represents damage that requires repair.

Figure 5:
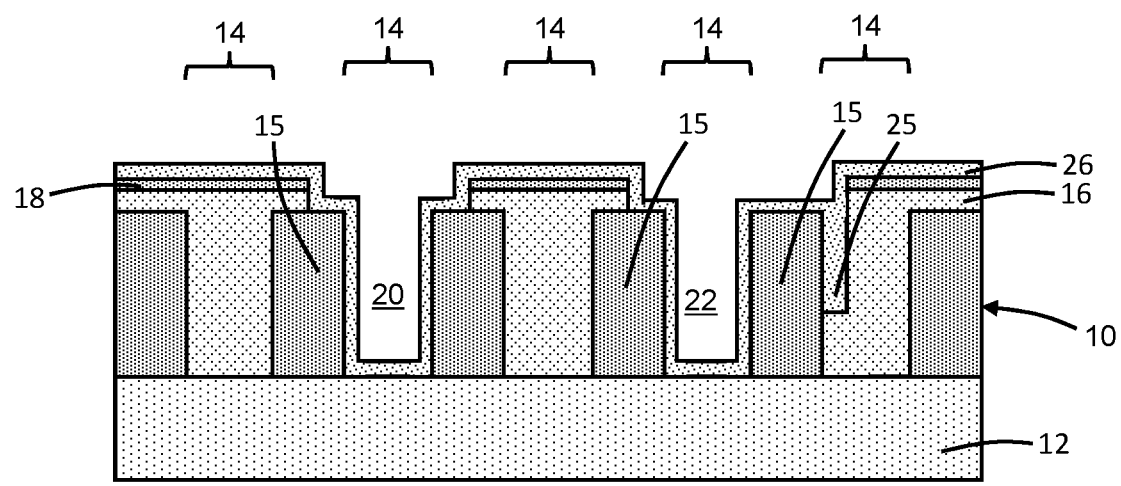
Figure 5A:
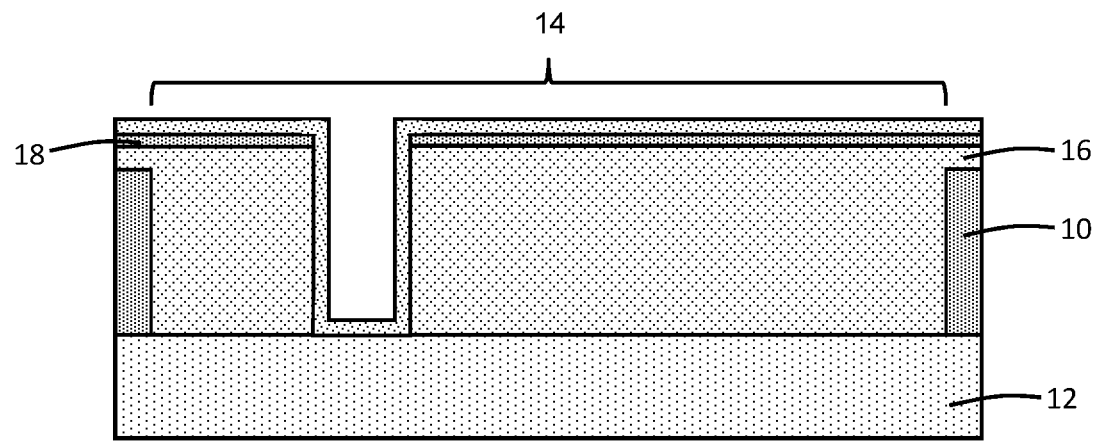

With reference to FIGS. 5, 5A in which like reference numerals refer to like features in FIGS. 4, 4A and at a subsequent fabrication stage of the processing method, a dielectric layer 26 is deposited as a liner that covers, among other things, the sidewalls of the cuts 20, 22, the planarizing layer 16, and the layer 12 at the base of the cuts 20, 22. The dielectric layer 26 also fills the cavity 24. For example, due to its small dimensions, the dielectric layer 26 may pinch off during deposition such that a section 25 of the dielectric layer 26 fills the cavity 24. The dielectric layer 26 is a conformal layer that may be composed of a dielectric material, such as silicon nitride, deposited by atomic layer deposition. The thickness of the dielectric layer 26 is limited to avoid pinch-off inside the cuts 20, 22.

Figure 6:
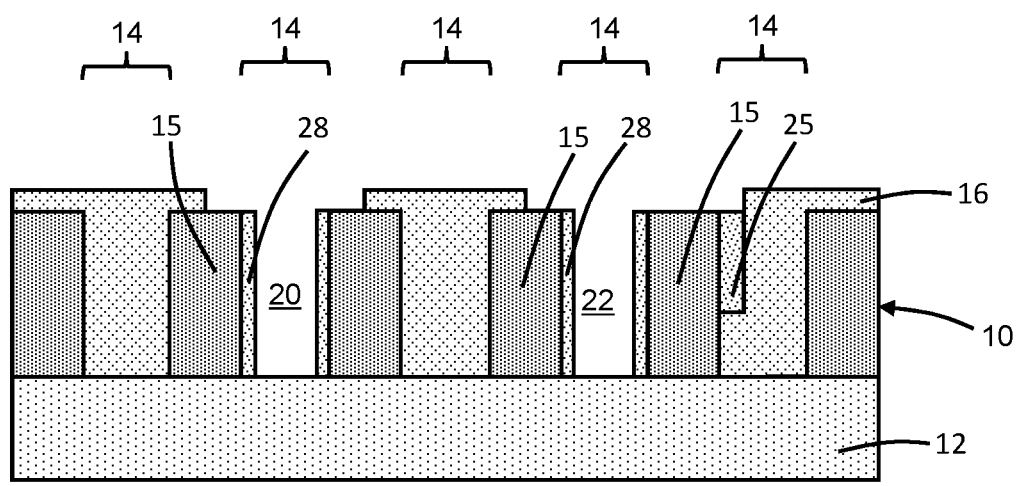
Figure 6A:
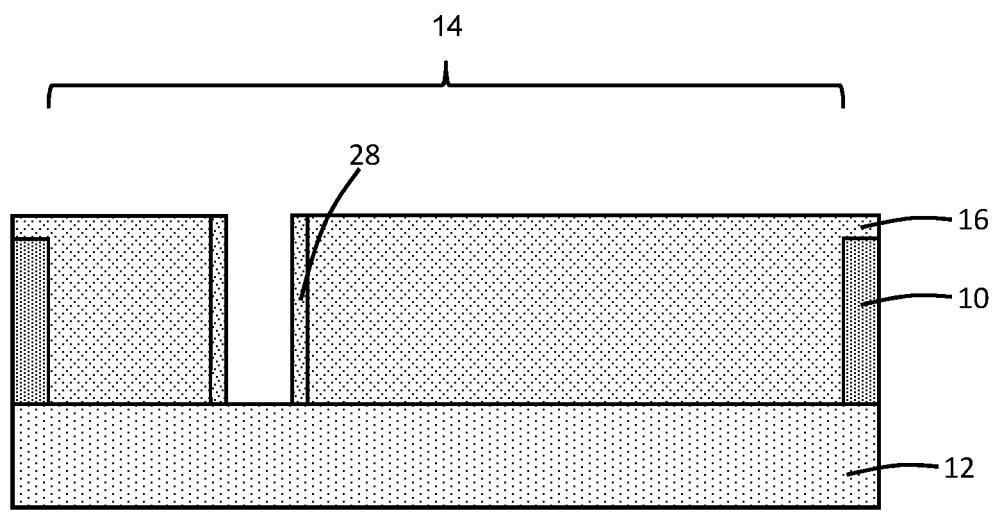

With reference to FIGS. 6, 6A in which like reference numerals refer to like features in FIGS. 5, 5A and at a subsequent fabrication stage of the processing method, the dielectric layer 26 is etched by an etching process to form sidewall spacers 28 inside the cuts 20, 22. The dielectric layer 26 is removed from the top surface of the planarizing layer 16 and from the layer 12 at the base of the cuts 20, 22. The etching process may be an anisotropic etching process, such as reactive ion etching (RIE), that removes the material of the dielectric layer 26 selective to the materials of the planarizing layer 16, the hardmask layer 18, and the interlayer dielectric layer 10. The section 25 of the dielectric layer 26 inside the cavity 24 is not removed by the etching process, and serves to plug the cavity 24 with solid dielectric material.

Figure 7:
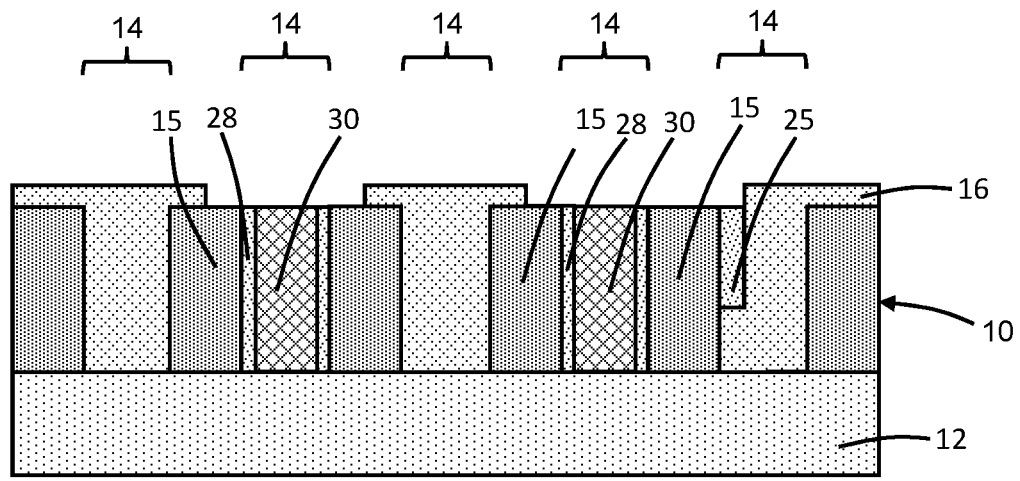
Figure 7A:
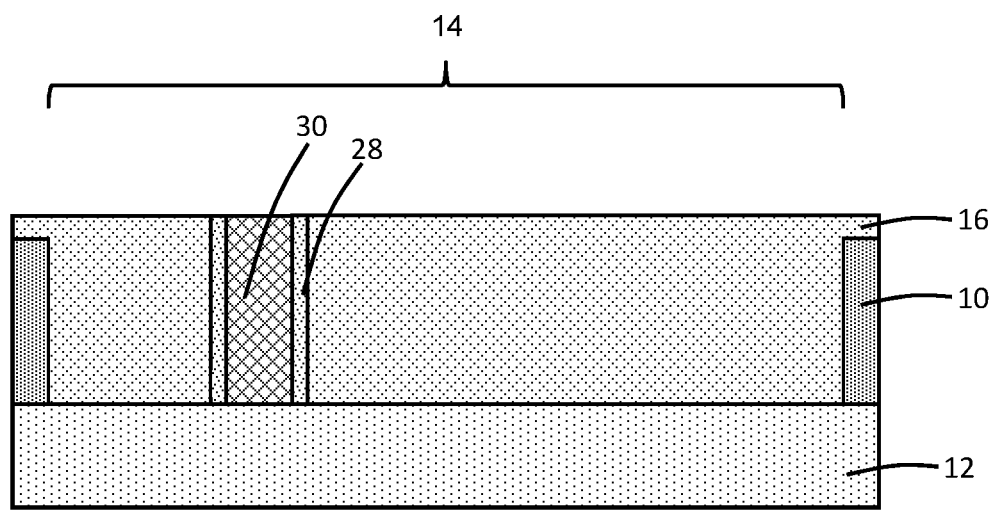

With reference to FIGS. 7, 7A in which like reference numerals refer to like features in FIGS. 6, 6A and at a subsequent fabrication stage of the processing method, a dielectric layer 30 is deposited and etched back with an etching process such that the dielectric material fills the cuts 20, 22. The dielectric layer 30 may be composed of an electrically-insulating dielectric material, such as a low-k dielectric material, deposited by chemical vapor deposition (CVD). The etching process also removes any remnants of the dielectric layer 26 over the lines 15 of the interlayer dielectric layer 10. The sections of the dielectric layer 30 in the cuts 20, 22 are separated from the lines 15 of the interlayer dielectric layer 10 by the sidewall spacers 28. The section 25 of the dielectric layer 26 inside the cavity 24 blocks the dielectric material of the dielectric layer 30 from depositing inside the cavity 24.

Figure 8:
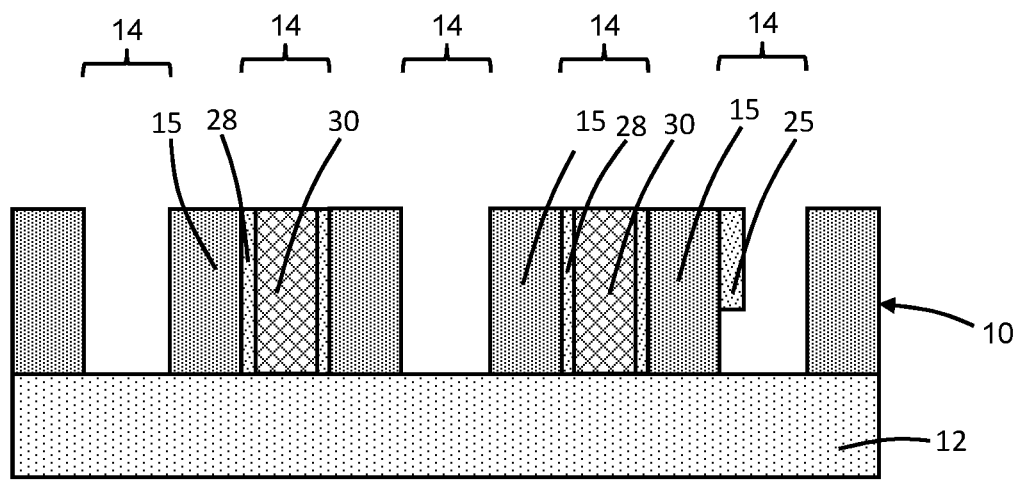
Figure 8A:
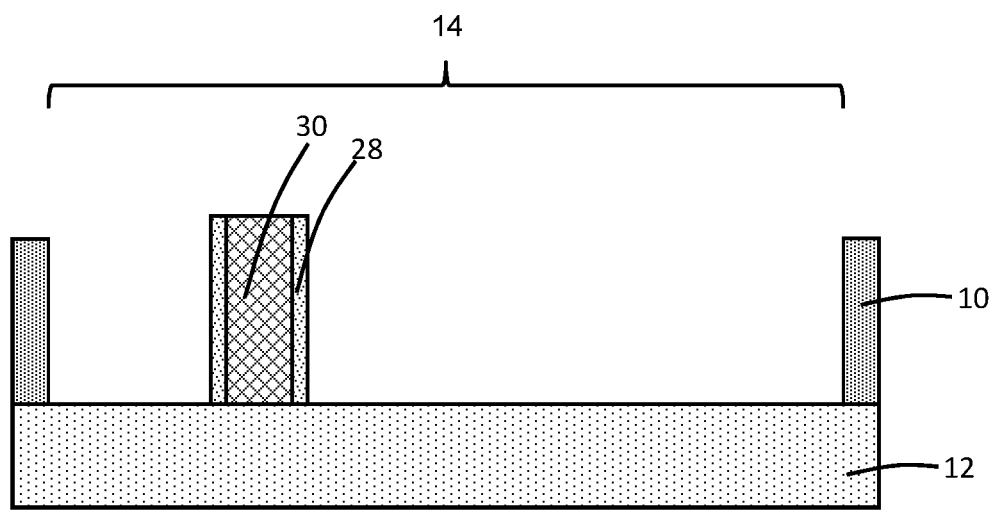

With reference to FIGS. 8, 8A in which like reference numerals refer to like features in FIGS. 7, 7A and at a subsequent fabrication stage of the processing method, the planarizing layer 16 is removed from the trenches 14 in the interlayer dielectric layer 10 by, for example, ashing with an oxygen plasma. The removal of the planarizing layer 16 reopens the trenches 14 for subsequent processing. The section 25 of the dielectric layer 26, which was arranged in the former cavity 24 in the planarizing layer 16, remains in one of the trenches 14 following the removal of the planarizing layer 16.

Figure 9:
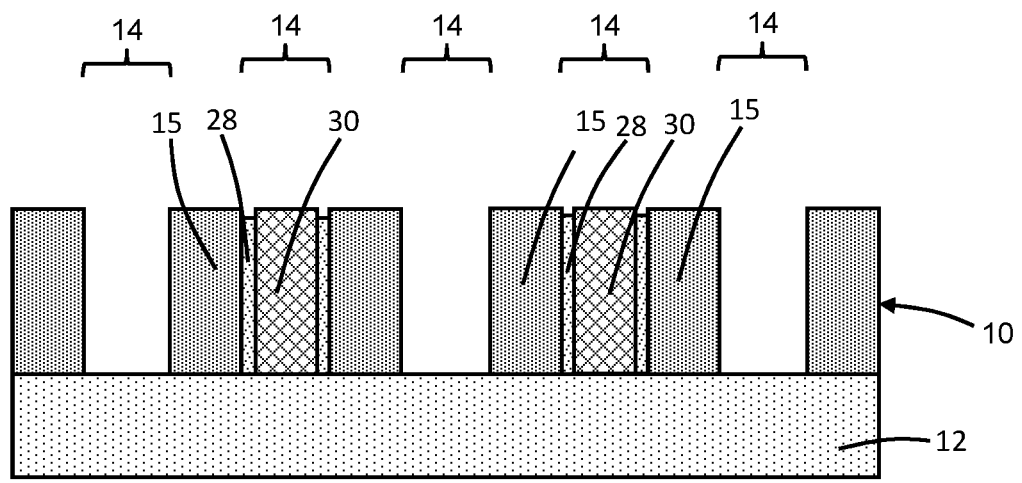
Figure 9A:
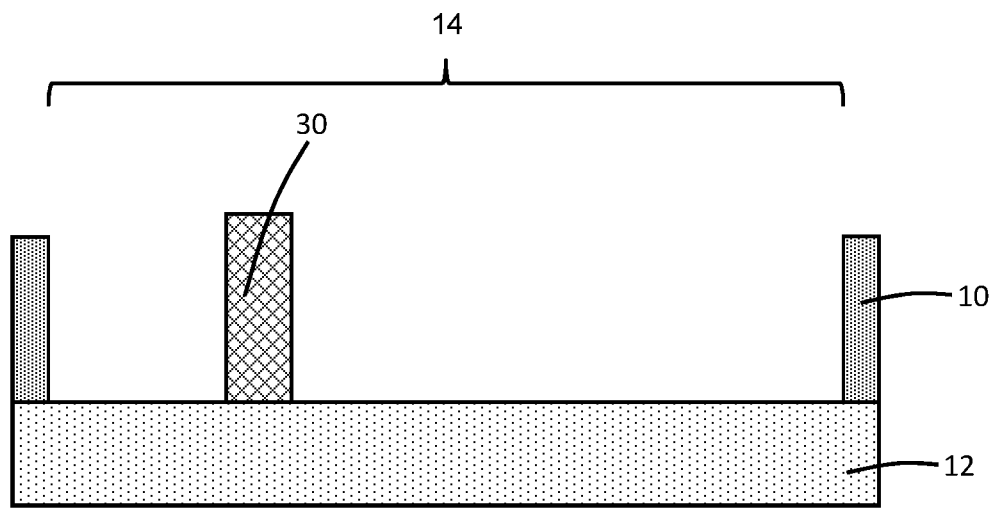

With reference to FIGS. 9, 9A in which like reference numerals refer to like features in FIGS. 8, 8A and at a subsequent fabrication stage of the processing method, the section 25 (FIG. 7) of the dielectric layer 26 formerly in the cavity 24 in the planarizing layer 16 is removed with an etching process. The etching process may be, for example, an isotropic wet chemical etching process that removes the material of the dielectric layer 26 selective to the materials of the interlayer dielectric layer 10 and the dielectric layer 30. As used herein, the terms "selective" and "selectivity" in reference to a material removal process (e.g., etching) denotes that the material removal rate (i.e., etch rate) for the targeted material is higher than the material removal rate (i.e., etch rate) for at least another material exposed to the material removal process. The sections of the sidewall spacers 28 between the dielectric layer 30 in the cuts 20, 22 and the lines 15 of the interlayer dielectric layer 10 may be slightly recessed by the removal of the section of the dielectric layer 26.

Figure 10:
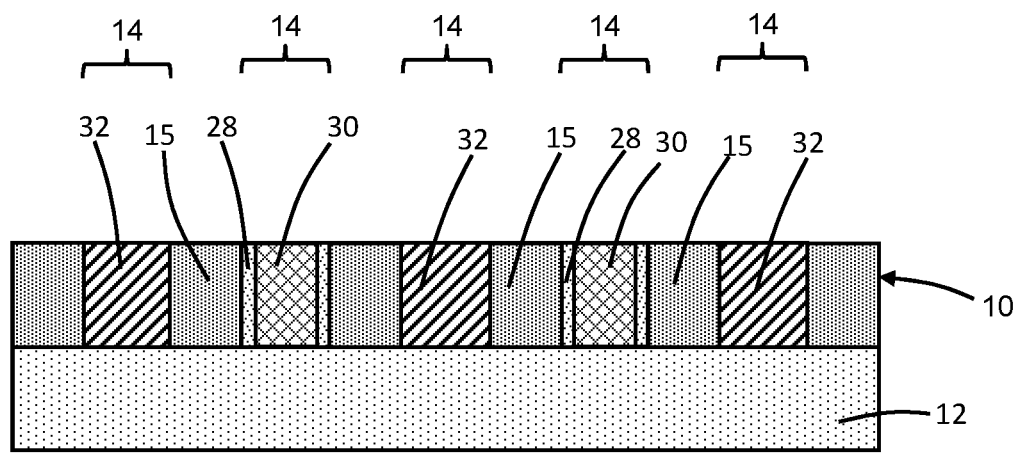
Figure 10A:
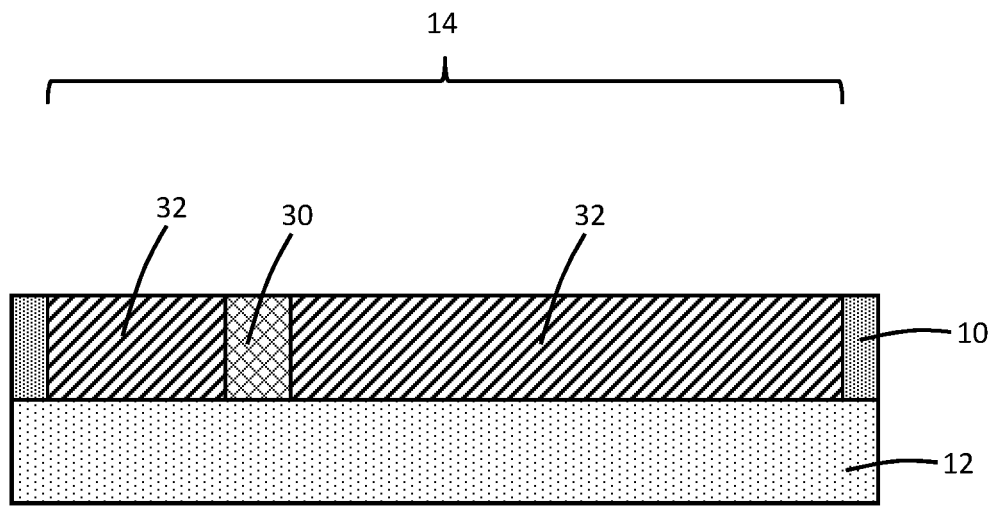

With reference to FIGS. 10, 10A in which like reference numerals refer to like features in FIGS. 9, 9A and at a subsequent fabrication stage of the processing method, interconnects 32 are then formed in the trenches 14 after the section of the dielectric layer 26 is removed. The primary conductor of the interconnects 32 may be composed of a low-resistivity metal formed using a deposition process, such as copper or cobalt deposited by, for example, electroplating or electroless deposition or chemical vapor deposition. A liner (not shown) composed of titanium, titanium nitride, tantalum, tantalum nitride, or a layered combination of these materials (e.g., a bilayer of tantalum nitride and tantalum) may be applied to the trenches 14 before filling with a primary electrical conductor. In an embodiment, the interconnects 32 may be conductive features located in a metallization level that is the closest of multiple metallization levels of a back-end-of-line interconnect structure to device structures in the layer 12, and in which the interconnects 32 may be connected with the device structures by contacts in an intervening contact level.

The sections of the dielectric layer 30 in the cuts 20, 22 within the trenches 14 provide discontinuities at selected lengthwise locations in the interconnects 32, and are self-aligned to the interconnects 32 by being formed using the planarizing layer 16 before forming the interconnects 32 in the trenches 14. The sections of the dielectric layer 30 in the cuts 20, 22 divide the associated interconnects 32 into sections with the dielectric material of the dielectric layer 30 arranged in the cut between the different sections. The sidewall spacers 28 are arranged in the respective trenches 14 between the interlayer dielectric layer 10 and the sections of the dielectric layer 30 in the cuts 20, 22, but are absent between the sections of the dielectric layer 30 in the cuts 20, 22 and the different sections of the divided interconnects 32.

Figure 11:
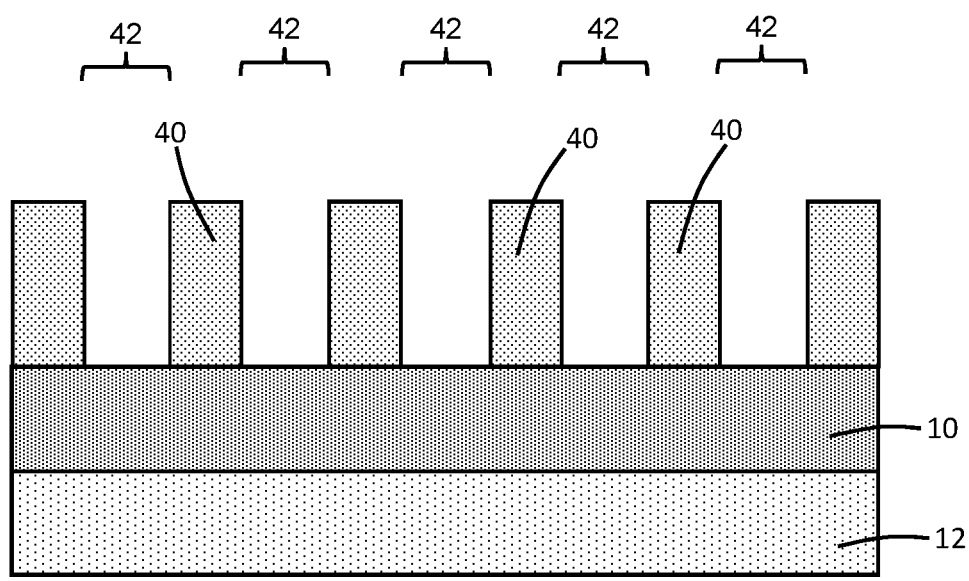
FIGS. 11-19 are cross-sectional views of a structure at successive fabrication stages of a processing method in accordance with alternative embodiments of the invention.

With reference to FIG. 11 and in accordance with alternative embodiments of the processing method, mandrel lines 40 may be formed from a layer of material that is deposited on a top surface of the interlayer dielectric layer 10 and patterned using EUV lithography and etching processes. The interlayer dielectric layer 10 is arranged over the layer 12 and may be associated with, for example, the lowest metallization level in the interconnect structure. The layer used to form the mandrel lines 40 may be composed of amorphous silicon (α-Si), amorphous carbon (α-Si), or a spin-on hardmask (SOH). The mandrel lines 40 are separated by non-mandrel lines 42 that expose strips (i.e., portions) of the interlayer dielectric layer 10.

Figure 12:
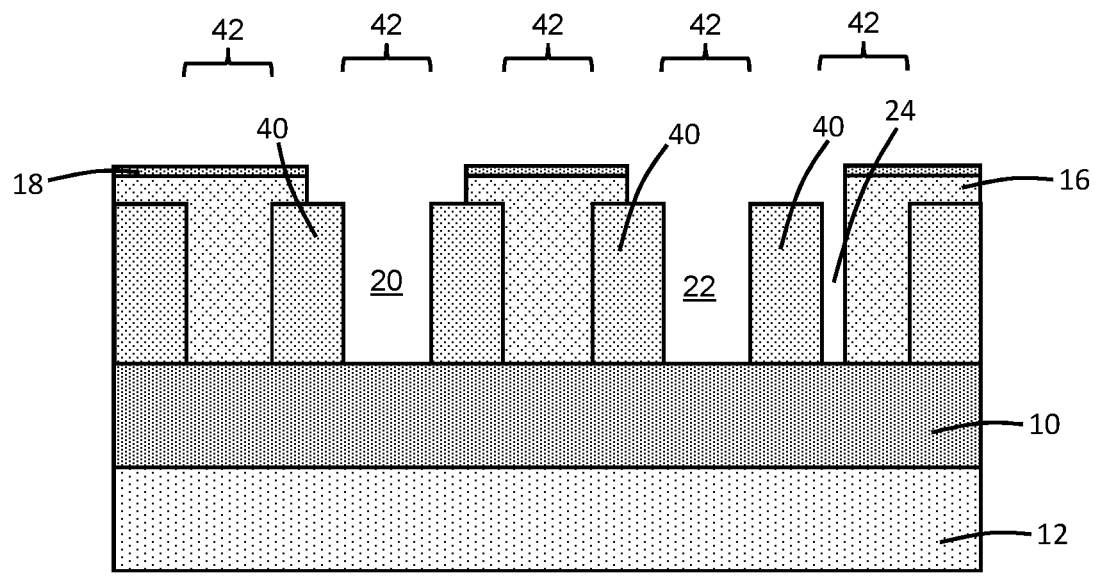

With reference to FIG. 12 in which like reference numerals refer to like features in FIG. 11 and at a subsequent fabrication stage of the processing method, the planarizing layer 16 and hardmask layer 18 are formed over the mandrel lines 40 and layer 12 as previously described. The planarizing layer 16 and hardmask layer 18 are patterned, as also previously described, to form the cuts 20, 22 in the planarizing layer 16. The cut 20 exposes one of the non-mandrel lines 42 and overlaps at its side edges with the adjacent mandrel lines 40. The cut 22 exposes one of the non-mandrel lines 42 and overlaps at its side edges with the adjacent mandrel lines 40, but extends laterally to overlap with an adjacent non-mandrel line 42 to generate the cavity 24 in the planarizing layer 16 arranged in this adjacent non-mandrel line 42. The cavity 24 may extend through the planarizing layer 16 to the top surface of the interlayer dielectric layer 10.

Figure 13:
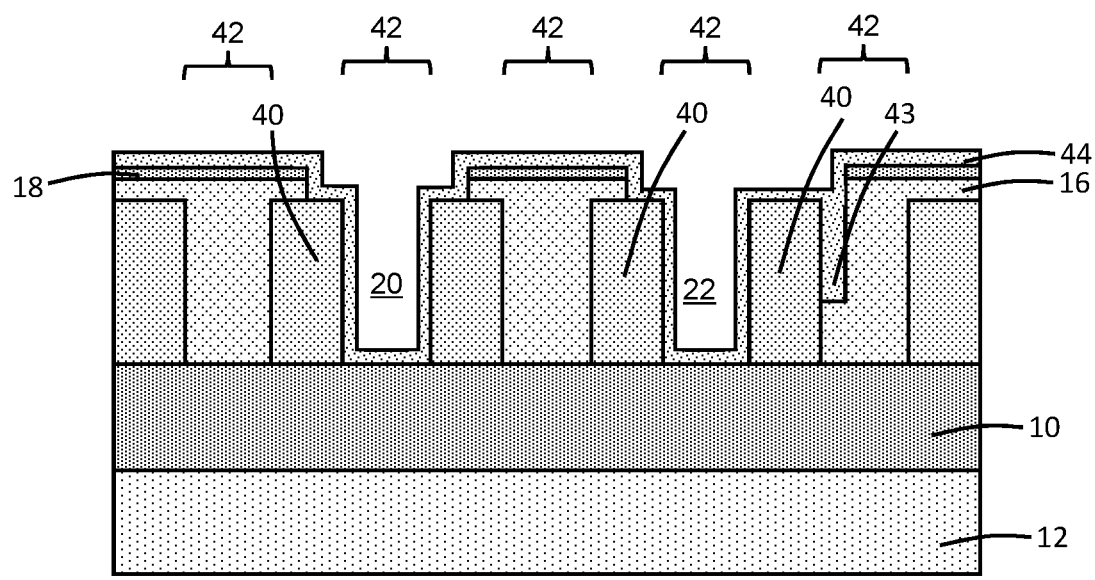

With reference to FIG. 13 in which like reference numerals refer to like features in FIG. 12 and at a subsequent fabrication stage of the processing method, a dielectric layer 44 is deposited as a liner that covers, among other things, the sidewalls of the cuts 20, 22 and the layer 12 at the base of the cuts 20, 22. A section 43 of the dielectric layer 44 also fills the cavity 24. For example, due to the small dimensions of the cavity 24, the dielectric layer 44 may pinch off during its deposition such that the section 43 fills the cavity 24. The dielectric layer 44 is a conformal layer that may be composed of a dielectric material, such as titanium oxide, silicon nitride, or aluminum oxide, deposited by atomic layer deposition. The thickness of the dielectric layer 44, while adequate to pinch off inside the cavity 24, is limited to avoid pinch-off inside the cuts 20, 22.

Figure 14:
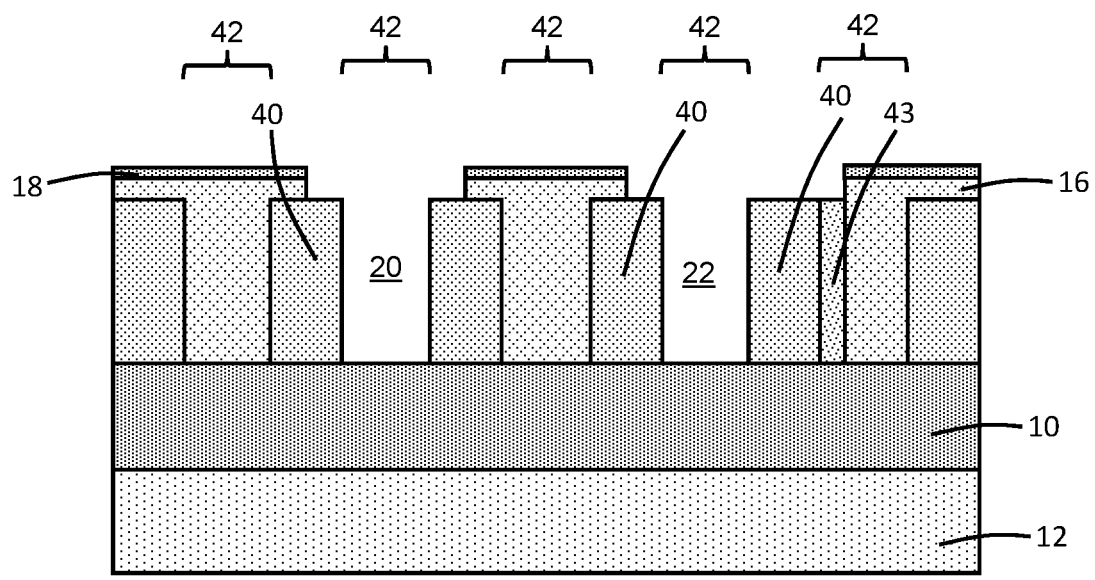

With reference to FIG. 14 in which like reference numerals refer to like features in FIG. 13 and at a subsequent fabrication stage of the processing method, the dielectric layer 44 is etched by an etching process, such as an isotropic wet chemical etching process, to fully remove the dielectric layer 44 with the exception of the section 43 of the dielectric layer 44 inside the cavity 24. In particular, the dielectric layer 44 is removed from inside the cuts 20, 22 in the planarizing layer 16. The etching process may remove the material of the dielectric layer 44 selective to the materials of the planarizing layer 16, the hardmask layer 18, and the mandrel lines 40.

Figure 15:
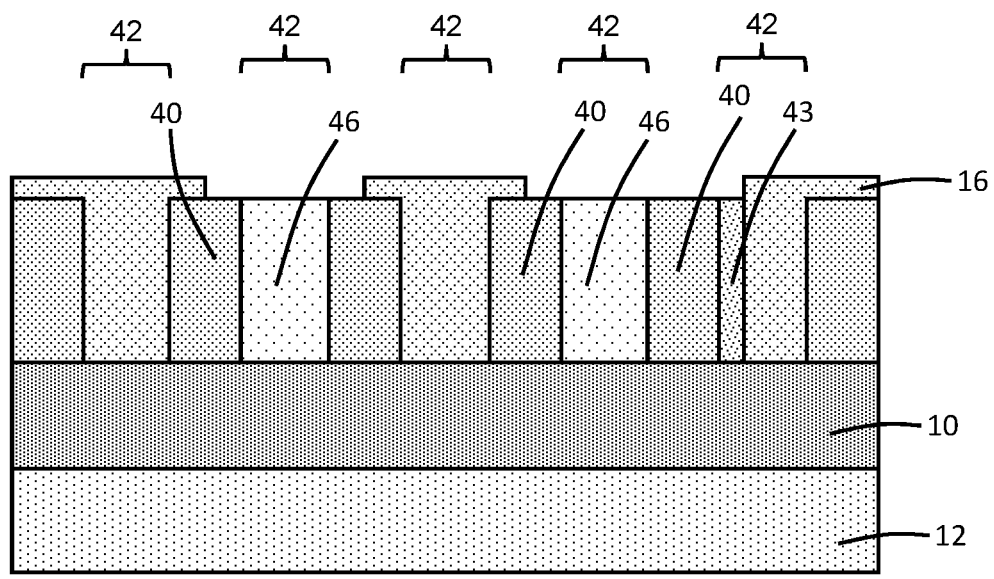

With reference to FIG. 15 in which like reference numerals refer to like features in FIG. 14 and at a subsequent fabrication stage of the processing method, sections of a dielectric layer 46 are formed in the spaces inside the cuts 20, 22. The dielectric layer 46 may be composed of a dielectric material, such as silicon nitride, deposited by plasma-enhanced atomic layer deposition (PEALD) and etched back with an etching process, such as a reactive ion etching process. The hardmask layer 18 may be removed by the etching process to expose the planarizing layer 16. The section 43 of the dielectric layer 44 inside the cavity 24 blocks the dielectric material of the dielectric layer 46 from depositing inside the cavity 24.

Figure 16:
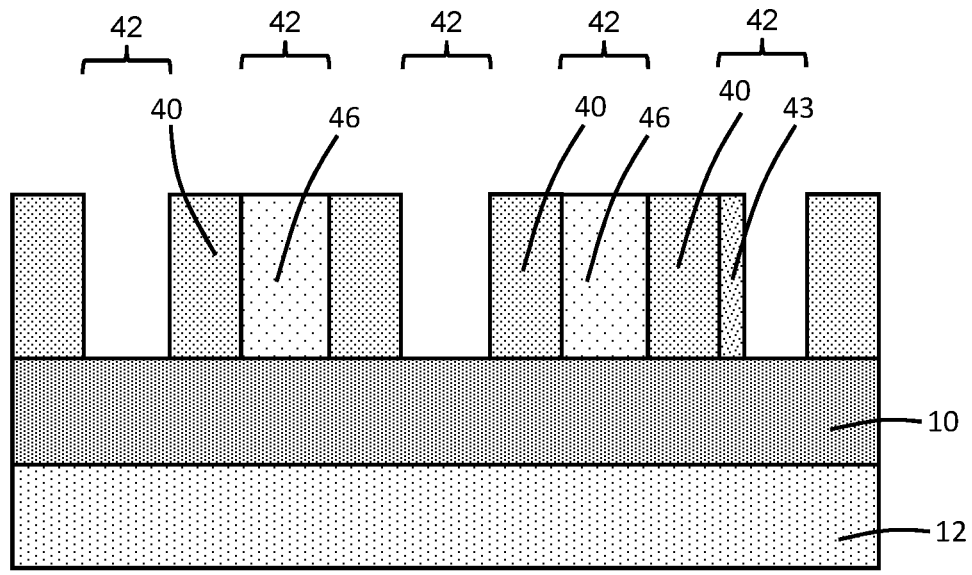

With reference to FIG. 16 in which like reference numerals refer to like features in FIG. 15 and at a subsequent fabrication stage of the processing method, the planarizing layer 16 is removed from the trenches 14 in the interlayer dielectric layer 10 by, for example, ashing with an oxygen plasma. The removal of the planarizing layer 16 reopens the non-mandrel lines 42 for subsequent processing. The section 43 of the dielectric layer 44, which was arranged in the former cavity 24 in the planarizing layer 16, remains in one of the non-mandrel lines 42 and adjacent to one of the mandrel lines 40 following the removal of the planarizing layer 16. The sections of the dielectric layer 46 also remain in the cuts 20, 22 following the removal of the planarizing layer 16.

Figure 17:
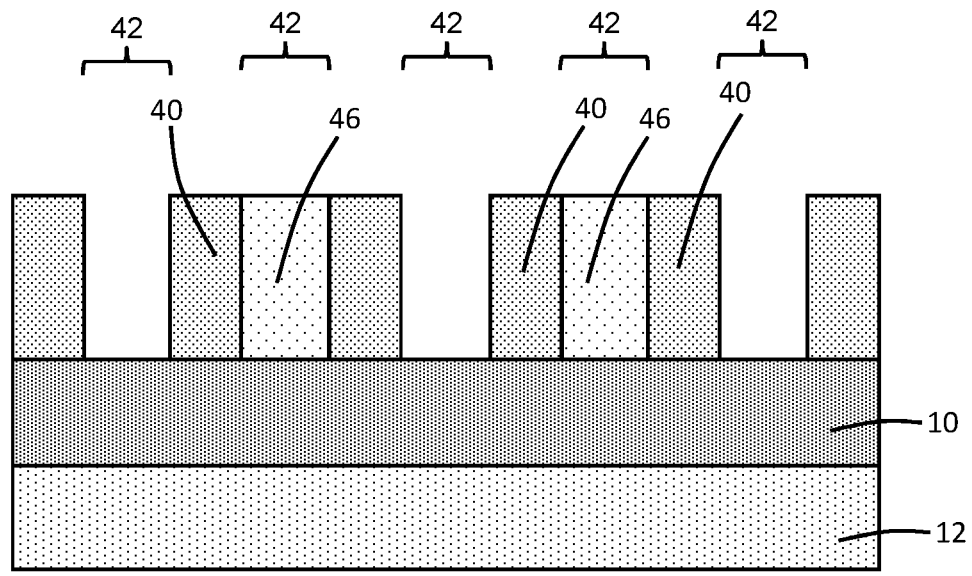

With reference to FIG. 17 in which like reference numerals refer to like features in FIG. 16 and at a subsequent fabrication stage of the processing method, the section 43 (FIG. 15) of the dielectric layer 44 formerly in the cavity 24 in the planarizing layer 16 is removed with an etching process. The etching process may be, for example, an isotropic wet chemical etching process that removes the material of the dielectric layer 44 selective to the materials of the dielectric layer 46 and the mandrel lines 40.

Figure 18:
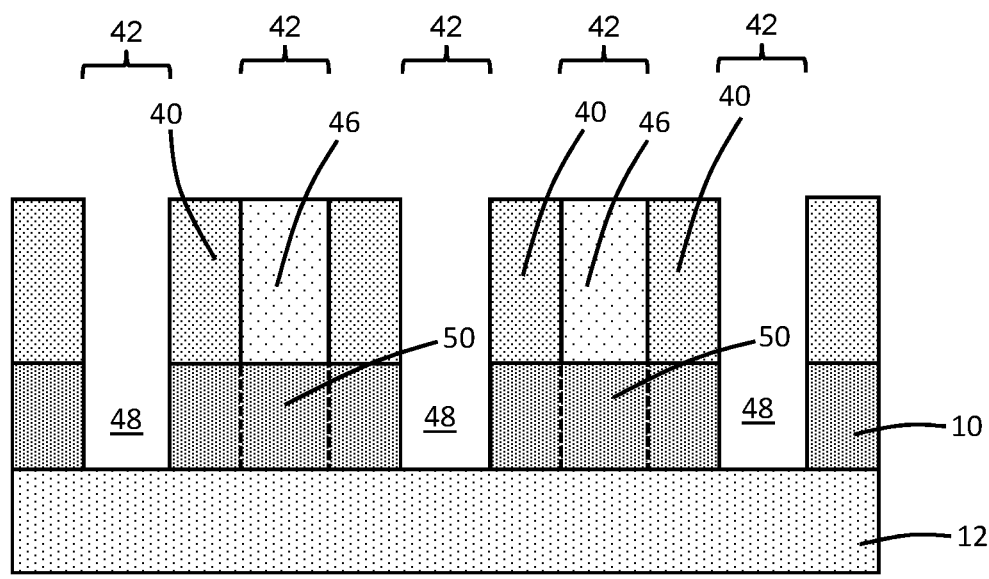

With reference to FIG. 18 in which like reference numerals refer to like features in FIG. 17 and at a subsequent fabrication stage of the processing method, the interlayer dielectric layer 41 is etched, after removing the section 43 of the dielectric layer 44, to form trenches 48 using an etching process, such as reactive ion etching, with the mandrel lines 40 and the sections of the dielectric layer 44 in the cuts 20, 22 operating as an etch mask. During the etching process, the sections of the dielectric layer 46 in the cuts 20, 22 function to mask and preserve underlying sections 50 of the interlayer dielectric layer 10 that divide the associated interconnects 32 into individual sections.

Figure 19:
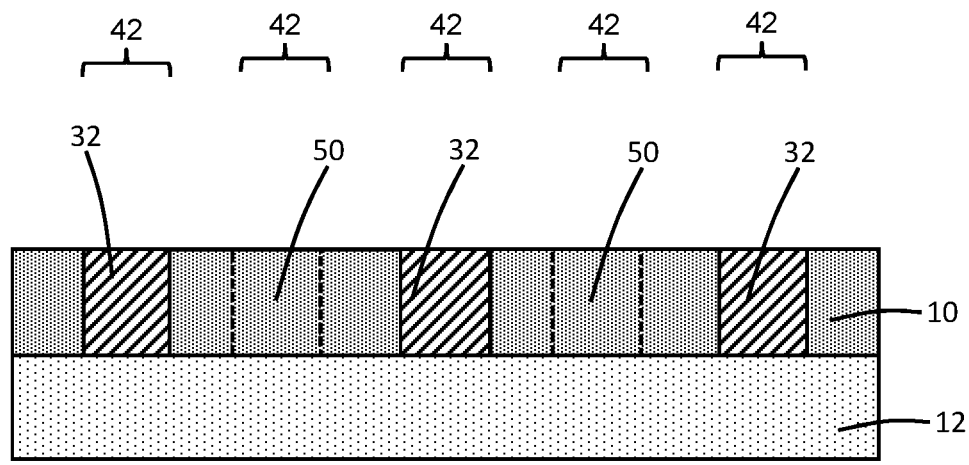

With reference to FIG. 19 in which like reference numerals refer to like features in FIG. 18 and at a subsequent fabrication stage of the processing method, the mandrel lines 40 and the sections of the dielectric layer 44 may be removed after forming the trenches 48. Interconnects 32 are subsequently formed in the trenches 48 as described previously, and the sections 50 of the interlayer dielectric layer 10 are arranged between disconnected interconnect sections.

Figure 20:
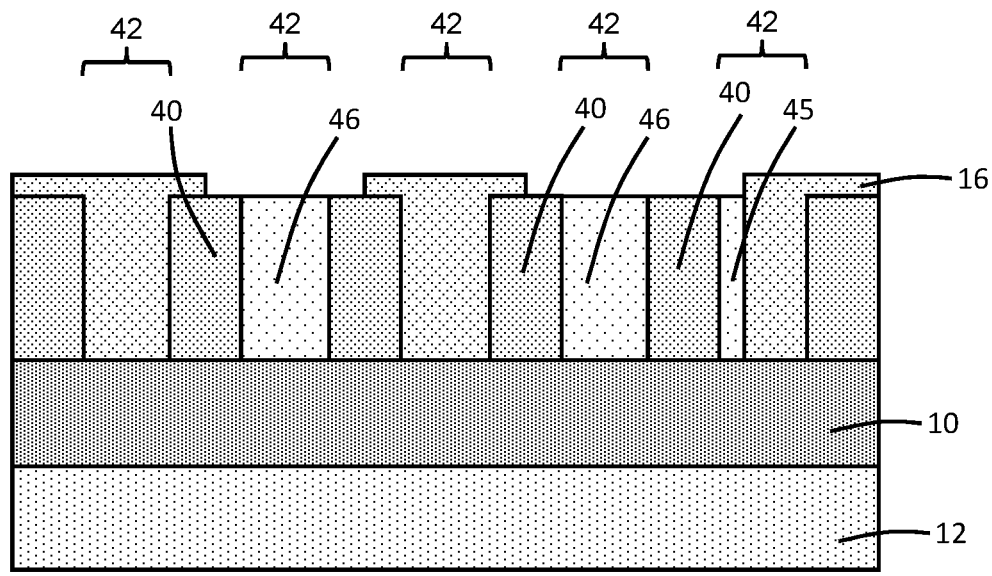
FIG. 20-21 are cross-sectional views of a structure at successive fabrication stages of a processing method in accordance with alternative embodiments of the invention.

With reference to FIG. 20 and in accordance with alternative embodiments of the processing method, the formation of the dielectric layer 44 may be skipped after the formation of the cuts 20, 22, and the dielectric layer 44 may be deposited, planarized, and recessed. Sections of the dielectric layer 46 are formed in the spaces inside the cuts 20, 22, and a section 45 of the dielectric layer 46 is also formed in the cavity 24 in the planarizing layer 16.

Figure 21:
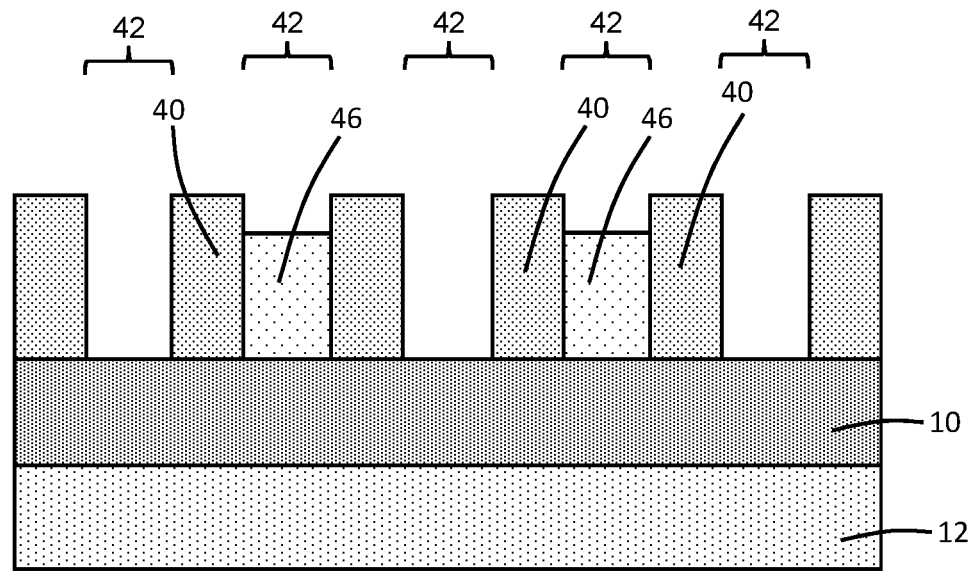

With reference to FIG. 21 in which like reference numerals refer to like features in FIG. 20 and at a subsequent fabrication stage of the processing method, the planarizing layer 16 is subsequently removed by, for example, plasma ashing, and an isotropic wet chemical etching process is then used to remove the section 45 of the dielectric layer 46. The sections of the dielectric layer 46 in the cuts 20, 22 may be recessed, but not removed, due to the presence of the surrounding mandrel lines 40. Processing continues, as described above, to form the trenches 48 in the interlayer dielectric layer 10 and the interconnects 32 in the trenches 48 with the sections 50 of the interlayer dielectric layer 10 in the cuts 20, 22 dividing the associated interconnects 32 into individual sections.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   patterning a layer to form a first feature, a second feature, and a third feature having a substantially parallel alignment with the second feature between the first feature and the third feature;
   forming a sacrificial layer arranged between the first feature and the second feature and between the second feature and the third feature;
   patterning the sacrificial layer to form a cut between the first feature and the second feature from which a first portion of the sacrificial layer is fully removed and to form a cavity in a second portion of the sacrificial layer between the second feature and the third feature;
   depositing a section of a dielectric material inside the cavity in the sacrificial layer;
   forming a first dielectric layer inside the cut between the first feature and the second feature; and
   after depositing the section of the dielectric material and forming the first dielectric layer, removing the sacrificial layer.

2. The method of claim 1 wherein depositing the section of the dielectric material inside the cavity in the sacrificial layer further comprises:
   conformally depositing a second dielectric layer inside the cut and inside the cavity.

3. The method of claim 2 further comprising:
   before forming the first dielectric layer, removing the second dielectric layer from the cut with an isotropic etching process,
   wherein the second dielectric layer remains in the cavity following the isotropic etching process.

4. The method of claim 3 further comprising:
   after removing the sacrificial layer, removing the second dielectric layer selective to the first dielectric layer.

5. The method of claim 2 further comprising:
   before forming the first dielectric layer, etching the second dielectric layer with an anisotropic etching process to form sidewall spacers inside the cut,
   wherein the second dielectric layer remains in the cavity following the anisotropic etching process.

6. The method of claim 5 further comprising:
   after removing the sacrificial layer, removing the second dielectric layer selective to the first dielectric layer.

7. The method of claim 2 wherein the section of the dielectric material is a portion of the second dielectric layer.

8. The method of claim 1 further comprising:
   after removing the sacrificial layer, removing the section of the dielectric material selective to the first dielectric layer.

9. The method of claim 1 wherein the first feature, the second feature, and the third feature are patterned using an extreme ultraviolet lithography process.

10. The method of claim 1 wherein the layer is formed on an interlayer dielectric layer, and the first feature, the second feature, and the third feature are a plurality of mandrel lines patterned from the layer.

11. The method of claim 10 wherein the mandrel lines alternate with a plurality of non-mandrel lines exposing the interlayer dielectric layer, and further comprising:
   after removing the sacrificial layer, removing the section of the dielectric material selective to the first dielectric layer.

12. The method of claim 11 further comprising:
   after removing the section of the dielectric material, patterning the interlayer dielectric layer with an etching process to form a plurality of trenches in the interlayer dielectric layer at respective locations of the non-mandrel lines; and
   forming a plurality of interconnects in the trenches in the interlayer dielectric layer,
   wherein the mandrel lines and the dielectric material in the cut provide an etch mask during the etching process.

13. The method of claim 1 wherein the layer is an interlayer dielectric layer, and the first feature, the second feature, and the third feature are a plurality of trenches patterned in the interlayer dielectric layer.

14. The method of claim 13 wherein the interlayer dielectric layer includes a plurality of lines that alternate with the trenches, and further comprising:
   after removing the sacrificial layer, removing the section of the dielectric material selective to the first dielectric layer; and
   forming a plurality of interconnects in the trenches in the interlayer dielectric layer that are separated by the lines of the interlayer dielectric layer.

15. The method of claim 1 wherein the dielectric material is comprised of silicon nitride, aluminum oxide, or titanium oxide, and the first dielectric layer is comprised of a low-k dielectric material.

16. The method of claim 1 where the section of the dielectric material is deposited inside the cavity in the sacrificial layer before the first dielectric layer is formed inside the cut in the sacrificial layer.

17. The method of claim 1 wherein patterning the sacrificial layer comprises:
   forming an etch mask over the sacrificial layer that includes an opening that exposes the first portion of the sacrificial layer between the first feature and the second feature, and that exposes the second portion of the sacrificial layer between the second feature and the third feature,
   wherein the cut and the cavity are concurrently formed by an etching process at a location of the opening in the etch mask.

* * * * *